(12) United States Patent
Park et al.

(10) Patent No.: US 12,419,053 B2
(45) Date of Patent: Sep. 16, 2025

(54) SEMI-CONDUCTOR DEVICE HAVING DOUBLE-GATE AND METHOD FOR SETTING SYNAPSE WEIGHT OF TARGET SEMI-CONDUCTOR DEVICE WITHIN NEURAL NETWORK

(71) Applicant: Seoul National University R&DB Foundation, Seoul (KR)

(72) Inventors: Byung-Gook Park, Seoul (KR); Myung-Hyun Baek, Seoul (KR); Taejin Jang, Seoul (KR)

(73) Assignee: Seoul National University R&DB Foundation, Seoul (KR)

( * ) Notice: Subject to any disclaimer, the term of this patent is extended or adjusted under 35 U.S.C. 154(b) by 1234 days.

(21) Appl. No.: 17/189,574

(22) Filed: Mar. 2, 2021

(65) Prior Publication Data

US 2022/0285381 A1    Sep. 8, 2022

(51) Int. Cl.

| | |
|---|---|
| *G06N 3/063* | (2023.01) |
| *G11C 16/04* | (2006.01) |
| *G11C 16/12* | (2006.01) |
| *G11C 16/14* | (2006.01) |
| *H10B 43/30* | (2023.01) |
| *H10D 89/60* | (2025.01) |

(52) U.S. Cl.
CPC ............. *H10B 43/30* (2023.02); *G06N 3/063* (2013.01); *G11C 16/0466* (2013.01); *G11C 16/12* (2013.01); *G11C 16/14* (2013.01); *H10D 89/601* (2025.01)

(58) Field of Classification Search
CPC ..... G11C 16/0466; G11C 16/12; G11C 16/14; H10B 43/30; H10D 89/601; G06N 3/063

USPC ........................................................ 365/149
See application file for complete search history.

(56) References Cited

U.S. PATENT DOCUMENTS

| | | | | |
|---|---|---|---|---|
| 2005/0285184 A1* | 12/2005 | Jung | ...................... | H10D 30/69 |
| | | | | 257/324 |
| 2006/0267134 A1* | 11/2006 | Tilke | ...................... | H10B 41/30 |
| | | | | 257/E21.546 |
| 2009/0127613 A1* | 5/2009 | Ikehashi | ................ | H10B 69/00 |
| | | | | 438/257 |

(Continued)

FOREIGN PATENT DOCUMENTS

| | | |
|---|---|---|
| KR | 10-2015-0014577 A | 2/2015 |
| KR | 10-2018-0127276 A | 11/2018 |

OTHER PUBLICATIONS

H. Kim et al., "Silicon-Based Floating-Body Synaptic Transistor with Frequency-Dependent Short-and Long-Term Memories," IEEE Electron Device Letters, vol. 37, No. 3, pp. 249-252 (Mar. 2016).

*Primary Examiner* — Ly D Pham
(74) *Attorney, Agent, or Firm* — Blank Rome LLP

(57) ABSTRACT

Embodiments relate to a semiconductor device including a body made of a first conducting semiconductor material, a source and a drain made of a second conducting semiconductor material and formed on the body, a first gate formed on the body with a gate insulating layer interposed between the first gate and the body, a second gate formed opposite the first gate with respect to the body, and an insulating layer stack having a charge storage layer formed between the body and the second gate, and a method for controlling a synapse weight of a target semiconductor device within a neural network including semiconductor devices.

14 Claims, 10 Drawing Sheets

(56) References Cited

U.S. PATENT DOCUMENTS

2010/0102372 A1* 4/2010 Lee .................. G11C 11/404
257/E27.084

* cited by examiner

SEMI-CONDUCTOR DEVICE HAVING DOUBLE-GATE AND METHOD FOR SETTING SYNAPSE WEIGHT OF TARGET SEMI-CONDUCTOR DEVICE WITHIN NEURAL NETWORK

FIELD OF THE INVENTION

Embodiments relate to a semiconductor device for a hardware based neural network, and more particularly, to a semiconductor device which may be positioned in an array structure of a NOR flash memory and is configured to perform a program operation through Fowler-Nordheim (FN) tunneling and a method for independently setting a synapse weight of a semiconductor device within a neural network that includes these semiconductor devices.

NATIONAL RESEARCH AND DEVELOPMENT SUPPORT

This work was supported by an Institute of Information & Communications Technology Planning & Evaluation (IITP) grant funded by the Korea government (MSIT) (2020-0-01294).

BACKGROUND OF THE INVENTION

Recently, there have been rapid developments in artificial intelligent related technology that emulates the functions of synapses and neurons of the biological nervous system. Many technologies that implement neural networks including synapses and neurons in software have been developed and are being developed. Additionally, technologies that implement the neural networks in hardware are also being vigorously developed.

The neural network implemented in hardware (hereinafter, "hardware neural network") includes a synapse array having a plurality of cells. To accurately design the hardware neural network, it is necessary to independently set the weight for each cell. To this end, it is necessary to independently control the weight of the hardware neural network for each cell.

In general, a group of device candidates for use as synapses include static random-access memory (SRAM), resistance change memory (for example, resistive random access memory (ReRAM)), phase change memory (PCM), spin torque transfer magnetic random access memory (STT_MRAM) and flash memory. Among them, the flash memory has non-volatile properties and very good characteristics in terms of reliability.

The flash memory may be classified into NOR flash memory and NAND flash memory according to the memory array structure. The NOR flash memory is a flash memory having an array structure in which a source region and a drain region are arranged in an alternating manner. The NOR flash memory is able to perform the weighted sum of synapses by reading source currents of unit synapses (for example, synapse blocks) since each cell is connected in parallel in the memory array as opposed to the NAND flash memory. Accordingly, to build the hardware neural network, it is effective to use the NOR flash memory.

Currently, the g NOR flash memory uses a channel hot electron (CHI) process for a program (PGM) operation for setting the weight. However, the CHI process requires a high drain current for the program (PGM) operation, which makes it difficult to manufacture the devices using polysilicon, so single-crystalline silicon is used to manufacture the devices, requiring high power consumption.

Meanwhile, a Fowler-Nordheim (FN) tunneling process is another way of the program operation. However, prior embodiments applying the FN tunneling process to the NOR flash memory has limitations for independently performing the program (PGM) operation for each cell.

FIG. 1 is a diagram for describing a prior problem faced when attempting to perform the program (PGM) operation on a target cell of the NOR flash memory through the FN tunneling process.

The NOR flash memory has an array structure including a word line WL, a bit line BL and a common source line SCL. When the FN tunneling process is applied to set the weight of the single target cell in a 2×2 block, a program voltage is applied through the word line WL0 connected to the target cell. Thus, program inhibit does not take place in two cells sharing the word line WL0 by the common source line irrespective of the voltage of the bit line BL0. That is, programming operations of other cells excepting the target cell cannot be inhibited.

SUMMARY OF THE INVENTION

According to an aspect of the present disclosure, there is provided a semiconductor device that maintains an array structure of a prior NOR flash memory in which drains of semiconductor devices are arranged adjacent to each other, and performs program (PGM)/erase (ERS) operation through Fowler-Nordheim (FN) tunneling between double gates.

In addition, the present disclosure further provides a method for independently setting a synapse weight of a target semiconductor device in a synapse block that includes semiconductor devices through the FN tunneling process.

A semiconductor device according to an aspect of the present disclosure may include a body made of a first conducting semiconductor material; a source and a drain that are made of a second conducting semiconductor material formed on the body; a gate insulating layer formed on the body; a first gate formed on the gate insulating layer; a second gate formed opposite the first gate, wherein the body is positioned between the first gate and the second gate; and an insulating layer stack having a charge storage layer formed between the body and the second gate.

In an embodiment, electrons of the first gate may tunnel into the second gate on a state where the source and the drain are floated if an electric field from the first gate to the second gate is formed by a potential difference between the first gate and the second gate.

In an embodiment, the insulating layer stack may further include a first stack insulating layer formed on the charge storage layer, and a second stack insulating layer formed opposite the first stack insulating layer. Here the charge storage layer is positioned between the first stack insulating layer and the second stack insulating layer.

In an embodiment, the first stack insulating layer may be configured to allow electric charges of the first gate to tunnel to the second gate if the electric field is formed by a potential difference between the first gate and the second gate. Here the potential difference between the first gate and the second gate causes to maintain each insulating layer without damaging each insulating layer.

In an embodiment, the first stack insulating layer may have a thickness of less than 7 nm.

In an embodiment, the first stack insulating layer may be further configured to prevent the electric charge tunneled in the charge storage layer from leaking when the electric field disappears.

In an embodiment, the first stack insulating layer may have a thickness of 3 nm or more.

In an embodiment, the second stack insulating layer may be configured to inhibit tunneling of electric charges of the first gate to the second gate if an electric field is formed by a potential difference between the first gate and the second gate. Here the potential difference between the first gate and the second gate causes to maintain each insulating layer without damaging each insulating layer.

In an embodiment, the second stack insulating layer may have a thickness of 8 nm or more.

In the above-described embodiments, the body may be made of any one of polysilicon, amorphous silicon and a combination thereof.

A neural network according to another aspect of the present disclosure has a plurality of semiconductor devices of the above mentioned embodiments as synapse cells. The neural network may be comprise a synapse block including a first synapse array and a second synapse array; drain lines; first gate lines; source lines. Here, the first synapse array includes a first semiconductor device and a second semiconductor device and a second synapse array includes a third semiconductor device and a fourth semiconductor device, each synapse array configured such that drains of different semiconductor devices are arranged adjacent to each other. The drain lines are electrically connected to a drain region of each synapse array. The first gate lines are electrically connected to a first gate of each synapse array. The source lines are electrically connected to a source region of the first synapse array and a source region of the second synapse array. The drain line and the first gate line receive an input signal from a pre-neuron, and the source line outputs a calculation result at the synapse block as an output signal to a post-neuron.

In an embodiment, the synapse block is configured to form a source signal based on the input signal and a preset weight for each semiconductor device when receiving the input signal.

In an embodiment, the output signal may be a sum of the source signals for each semiconductor device.

In an embodiment, the synapse block may connect the pre-neuron and the post-neuron through first switching devices which switch on/off electrical connections of the pre-neuron, the post-neuron and the synapse block. The synapse block may be further connected to a control circuit through second gate lines electrically connected to a second gate of the first synapse array and a second gate of the second synapse array, and a second switching device which switches on/off an electrical connection between the control circuit and the synapse block, wherein the control circuit controls the semiconductor device through at least some of the plurality of lines.

In an embodiment, the output of the calculation result may be performed in an ON state of the first switching device and an OFF state of the second switching device, and the operation of the control circuit may be performed in an OFF state of the first switching device and an ON state of the second switching device.

A method for setting a synapse weight of a target semiconductor device in a synapse array including a plurality of semiconductor devices according to still another aspect of the present disclosure may include: controlling a potential difference between a first gate and a second gate of the target semiconductor device to form an electric field for tunneling of electric charge in the target semiconductor device that has a preset weight through tunneling; controlling a voltage of a second gate of another semiconductor device to prevent tunneling of electric charge in the other semiconductor device, the another semiconductor device sharing a first gate line between the first gate of the target semiconductor device and a control circuit; and controlling a voltage of a first gate of other semiconductor device to prevent tunneling of electric charge in the another semiconductor device, the other semiconductor device sharing a second gate line between the second gate of the target semiconductor device and the control circuit.

In an embodiment, controlling the potential difference between the first gate and the second gate of the target semiconductor device may include applying a first voltage to the second gate of the target semiconductor device, and applying a second voltage to the first gate of the target semiconductor device. Here, the potential difference between the first gate and the second gate of the target semiconductor device forms a channel for tunneling of an electron of the first gate to the second gate.

In an embodiment, according to the method, controlling the voltage of the second gate of another semiconductor device may include applying a same voltage as the voltage of the first gate of the target semiconductor device to the second gate of the other semiconductor device.

In an embodiment, controlling the voltage of the first gate of the other semiconductor device may include applying a third voltage to the first gate of the other semiconductor device to reduce to below the potential difference between the first gate and the second gate of the target semiconductor device.

In an embodiment, the third voltage may be a voltage which brings a potential difference between the first gate and the second gate of the other semiconductor device to 40% to 60% of the potential difference between the first gate and the second gate of the first semiconductor device.

Advantageous Effects

The semiconductor device according to an aspect of the present disclosure includes double gates, and has an asymmetrical structure with respect to the body. With the above-described semiconductor device, it is possible to form an array structure of a NOR flash memory in which drains of semiconductor devices within the same array are arranged adjacent to each other. Here, lines which control the drains are configured in contact with each other to share the adjacent drains within the same array.

The semiconductor device may perform the program operation through Fowler-Nordheim (FN) tunneling between the double gates. In particular, under the above-described array structure, it is possible to independently set the weight of the target semiconductor device through FN tunneling.

When the program (PGM) operation is performed through the FN tunneling process, it is possible to reduce power consumption to about 1/1000 of that of the channel hot electron (CHI) process.

As a result, using the semiconductor device, it is possible to form a low power/high integration synapse array, and further, to improve the performance compared to the existing NOR flash memory based neural networks.

Further, when polycrystalline semiconductor materials (such as, for example, polysilicon) commonly used in the field of semiconductors are used for the body of the semiconductor device, it is easy to expand to an array structure, and there are advantages in terms of process complexity and integration.

BRIEF DESCRIPTION OF THE DRAWINGS

The following is a brief introduction to necessary drawings in the description of the embodiments to describe the technical solutions of the embodiments of the present disclosure or the existing technology more clearly. To identify similar elements shown in at least one drawing, a same reference numeral is used. It should be understood that the accompanying drawings are for the purpose of describing the embodiments of the present disclosure and are not intended to be limiting of the present disclosure. Additionally, for clarity of description, illustration of some elements in the drawings may be exaggerated and omitted.

DETAILED DESCRIPTION OF THE PREFERRED EMBODIMENTS

Figure 1:
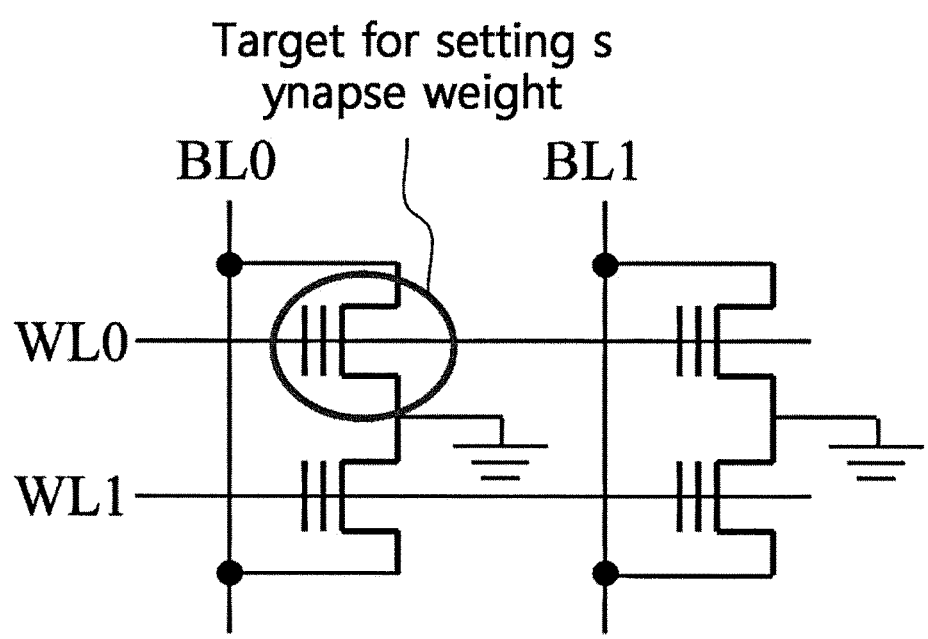
FIG. 1 is a diagram for describing a problem faced when attempting to perform a program (PGM) operation on a target cell of an existing NOR flash memory through a Fowler-Nordheim (FN) tunneling process.

Hereinafter, the embodiments of the present disclosure will be described in detail with reference to the accompanying drawings.

When an element is referred to as being "on" another element, the element may be on the other element, or intervening elements may be interposed between. In contrast, when an element is referred to as being "immediately on" another element, there is no intervening element between them.

The terms "first", "second", "third" and the like are used to describe various portions, components, regions, layers and/or sections, but are not limited thereto. These terms are used to distinguish a portion, component, region, layer or section from another portion, component, region, layer or section. According, a first portion, component, region, layer or section described herein may be referred to as a second portion, component, region, layer or section without departing from the range of the present disclosure.

The terminology used herein is for the purpose of describing particular embodiments only and is not intended to be limiting of the present disclosure. As used herein, the singular forms are intended to include the plural forms as well, unless the context clearly indicates otherwise. The term "comprises" when used in this specification, specify the presence of stated features, regions, integers, steps, operations, elements, and/or components, but do not preclude the presence or addition of one or more other features, regions, integers, steps, operations, elements and/or components.

The terms indicating relative spaces such as "below", "on" and the like may be used to describe a relationship of an element to another element shown in the drawing more easily. These terms are intended to include not only the intended meanings in the drawings but also other meanings or operations of a device used. For example, when the device in the drawing is reversed, elements described as being "below" other elements are understood as being "on" the other elements. Accordingly, the exemplary term "below" includes both up and down directions. The device may rotate at 90° or different angles, and the terms indicating relative spaces are interpreted accordingly.

Unless otherwise defined, all terms including technical and scientific terms used herein have the same meaning as commonly understood by those skilled in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

A semiconductor device according to embodiments of the present disclosure may form an array structure having a similar structure to a NOR flash memory. Each semiconductor device in the array structure may independently perform a write (or program (PGM) and/or erase (ERS)) operation through Fowler-Nordheim (FN) tunneling.

In an embodiment, the semiconductor device acts as a synapse cell for forming a hardware based neural network. The neural network includes at least one synapse block, and the synapse block incudes a plurality of synapse cells. In the specification, the synapse cell refers to the semiconductor device used in the neural network, and thus the terms "semiconductor device" and "synapse cell" are interchangeably used herein. Additionally, since a series of semiconductor devices are arranged, the terms "memory array" and "synapse array" are also interchangeably used herein.

Semiconductor Device and Synapse Array

Figure 2:
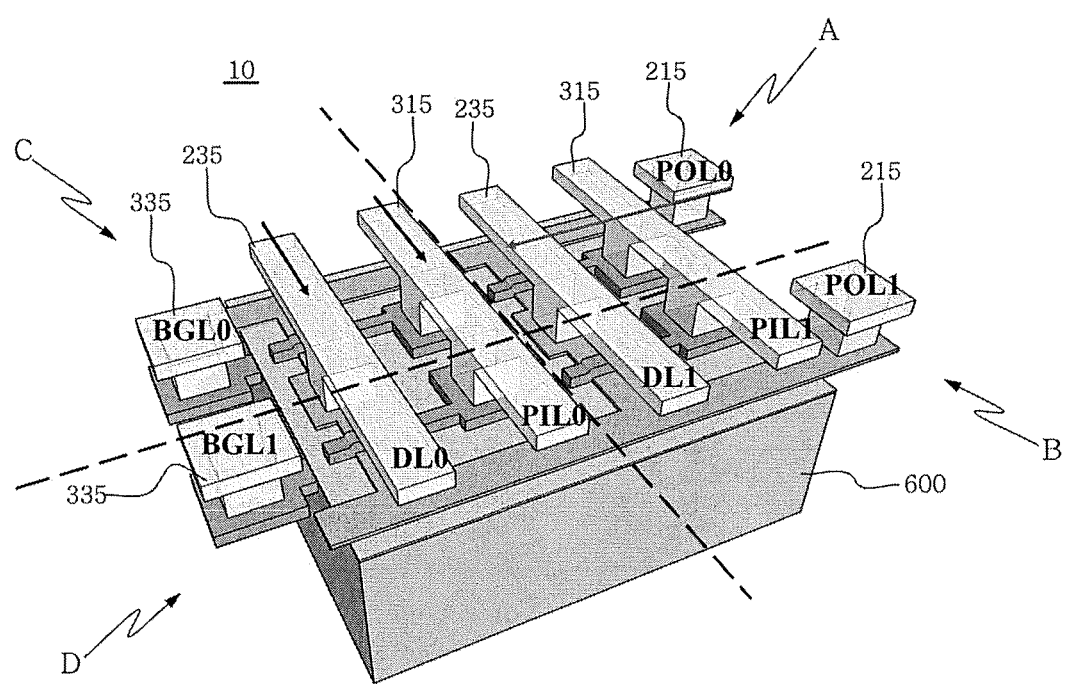
FIG. 2 is a conceptual perspective view of a synapse block having a synapse array including a plurality of semiconductor devices according to an embodiment of the present disclosure.

FIG. 2 is a conceptual perspective view of a synapse block having a synapse array including a plurality of semiconductor devices according to an embodiment of the present disclosure.

Referring to FIG. 2, the synapse block 10 includes a plurality of semiconductor devices. The synapse block 10 has a synapse array in which at least one semiconductor device is arranged.

In an embodiment, the synapse block 10 includes a first synapse array including a first semiconductor device A and a second semiconductor device B. Additionally, in some embodiments, the synapse block 10 includes a second synapse array including a third semiconductor device C and a fourth semiconductor device D. The first synapse array and the second synapse array are arranged in parallel.

Hereinafter, the embodiments of the present disclosure will be described in detail using the synapse block 10 of 2×2 semiconductor devices. However, it will be obvious to those skilled in the art that the configuration of the synapse block 10 of the present disclosure is not limited thereto.

Figure 3:
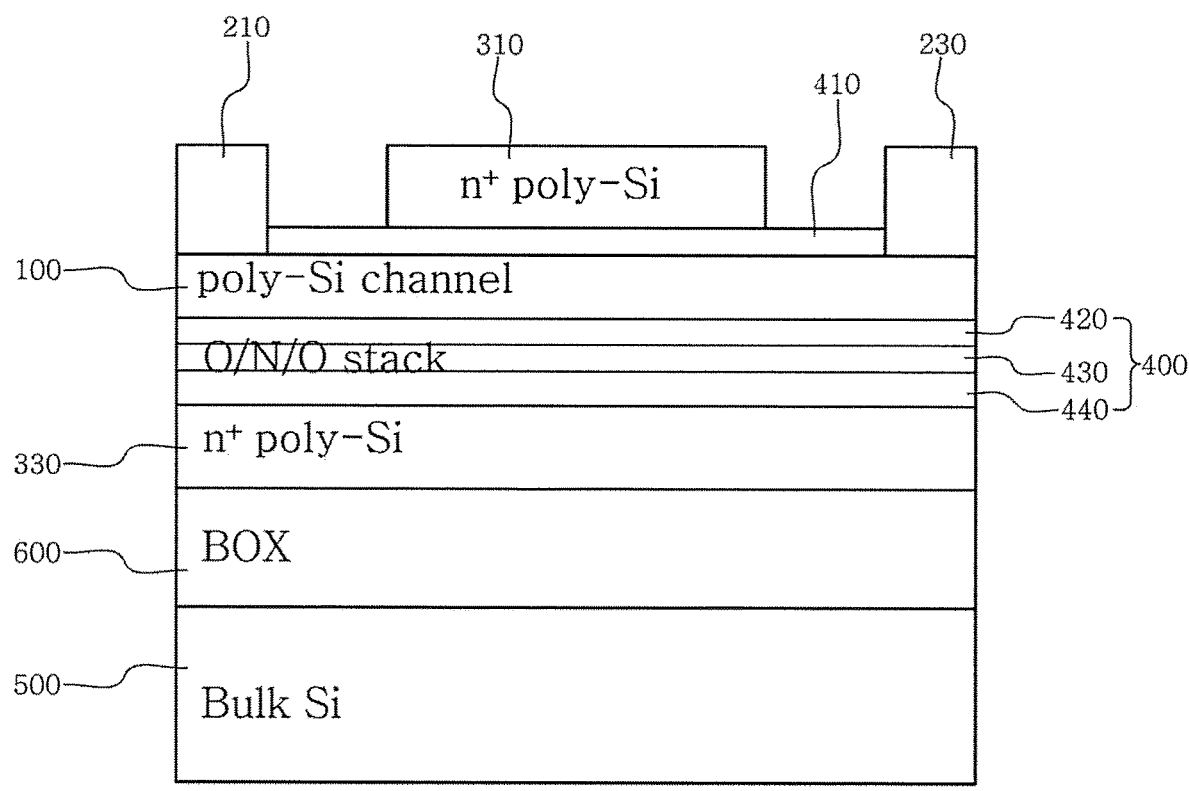
FIG. 3 is a conceptual cross-sectional view showing a semiconductor device according to an embodiment of the present disclosure.

FIG. 3 is a conceptual cross-sectional view showing the semiconductor device according to an embodiment of the present disclosure.

Referring to FIG. 3, the semiconductor device of the synapse block 10 includes: a body 100; a source 210 and a drain 230; a first gate 310; a gate insulating layer 410; a second gate 330; and an insulating layer stack 400 having a charge storage layer 430.

The body 100 is made of a first conducting (for example, p-type) semiconductor material. Both of the source 210 and the drain 230 are made of a second conducting (for example, n-type) semiconductor material.

The source 210 and the drain 230, and the gate insulating layer 410 are formed on a surface of the body 100. The source 210 and the drain 230 are positioned in contact with the body 100 and are spaced apart from each other. The first gate 310 is formed the gate insulating layer 410.

The body 100 is positioned between the first gate 310 and the second gate 330. The insulating layer stack 400 is formed between the body 100 and the second gate 330.

In some embodiments, the semiconductor device may be formed on a construction that includes a substrate 500 and an embedded oxide layer 600.

In the specification, the first gate 310 may be referred to as a top-gate, and the second gate 330 may be referred to as a bottom-gate because the first gate 310 is disposed at a higher position than the second gate 330 with respect to the substrate 500, shown in the FIG. 3.

The body 100 may be formed from a material selected from the group consisting of polycrystalline semiconductor materials in which grain boundaries are clearly defined, including polysilicon or polycrystalline germanium, but is not limited thereto. Alternatively, the body 100 may be formed from a material selected from the group consisting of amorphous semiconductor materials. The body 100 is formed from a polycrystalline or amorphous semiconductor material instead of a single-crystalline semiconductor material, thereby allowing 3D stacking.

The semiconductor device has the double gate 310, 330. The body 100 is located between the double gate 310, 330. The semiconductor device is configured to store electric charge in the charge storage layer 430 of the insulating layer stack 400. When an electric field is formed in the semiconductor device, electric charge is stored in the charge storage layer 430. The electric charge stored in the charge storage layer 430 is electrically isolated to prevent leaks after the electric field disappears. In an embodiment, as shown in FIG. 3, the insulating layer stack 400 may include insulating layers 420, 440. The charge storage layer 430 is disposed between the insulating layers 420, 440.

In an embodiment, the double gates 310, 330 may be made of a polycrystalline semiconductor material including polysilicon. Additionally, the double gates may be made of a first conducting semiconductor material (for example, n-type materials).

Figure 4:
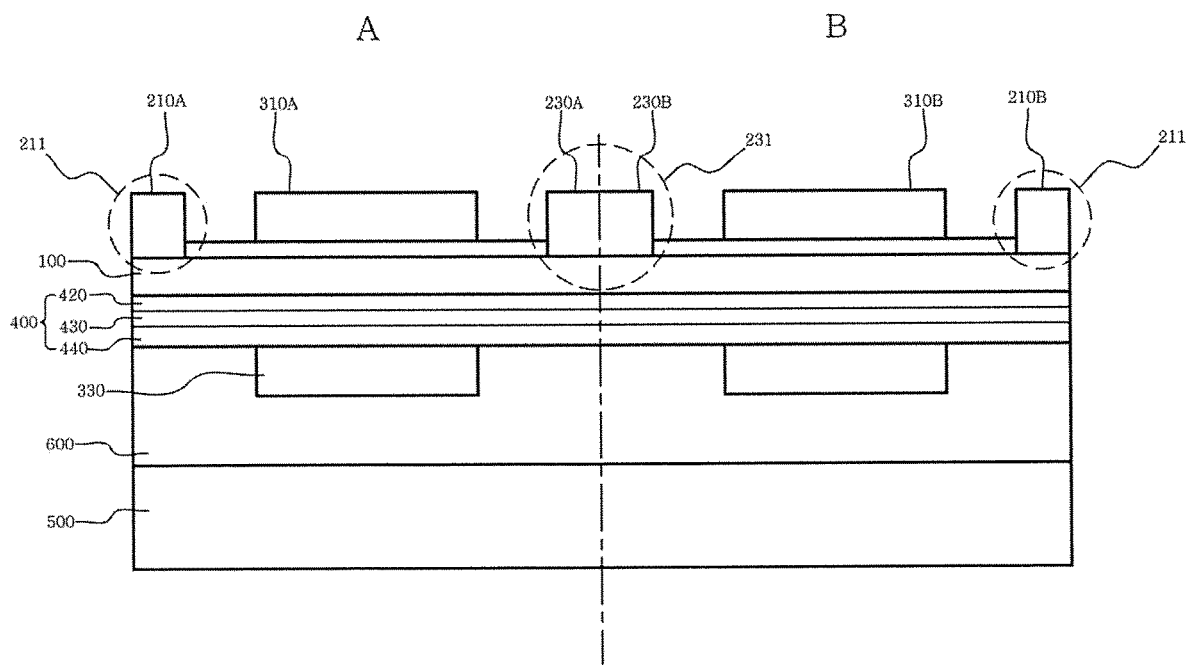
FIG. 4 is a cross-sectional view of a synapse array included in a synapse block according to an embodiment of the present disclosure.

FIG. 4 is a cross-sectional view of the synapse array included in the synapse block according to an embodiment of the present disclosure.

In the neural network, the program/erase operation is performed for each synapse block. The programming/erasing method of the synapse block 10 depends on the array structure of the semiconductor device.

Referring to FIG. 4, the synapse array includes at least two semiconductor devices, and has an array structure in which drains of semiconductor devices are arranged adjacent to each other.

For example, in the synapse array having first and second semiconductor devices A, B, a drain region 231 includes drains (for example, 230A, 230B) of the different semiconductor devices A, B. Additionally, a source region 211 of the synapse array includes sources 210A, 210B of the semiconductors A, B.

The adjacent drains (for example, 230A, 230B) share a line through the drain region 231. In FIG. 2, the drain line 235 is connected to the drains 230A, 230B at the drain region 231.

In some embodiments, the synapse array may be further configured in which sources of different semiconductor devices are also arranged adjacent to each other. For example, when the synapse array includes at least three semiconductor devices A, B, C, sources (for example, 210B, 210C) of different semiconductor devices B, C are arranged. When the synapse array in which sources are arranged adjacent to each other is used in the neural network, the adjacent sources (for example, 210B, 210C) do not share a line and are connected to separate lines and each configured to output a calculation signal for an input signal of the post-neuron. Referring FIGS. 2 and 4, the sources 210B, 210C are connected to the different source lines 215 respectively.

The synapse array in the synapse block 10 in the embodiments (for example, shown in FIG. 4) is similar to the array structure of the prior NOR flash memory. But the synapse array is configured to work in an operation principle that is different from the operation principle of the prior NOR flash memory, as described below.

The prior NOR flash memory performs the program operation through a channel hot electron (CHI) process. The CHI process applies a high voltage (for example, 12V to 14V) to a control gate, and applies a voltage to a drain, the voltage is high but lower than the voltage of the control gate. Accordingly, a semiconductor device designed to perform the program/erase operation through the CHI process requires a relatively high drain current. When the body 100 is formed from a polycrystalline or amorphous semiconductor material, it is difficult to perform the program operation through the CHI process due to the lower allowable current than a single-crystalline semiconductor material.

In contrast, the semiconductor device of the synapse block 10 has a similar array structure to the array structure of the existing NOR flash memory, but performs the program and/or erase operation through a FN tunneling process rather than the CHI process.

Program Operation

Referring back to FIG. 2, the program operation of the semiconductor device will be described.

The semiconductor device of the present disclosure performs the program operation by forming a channel from the top gate 310 to the bottom gate 330 through FN tunneling. The synapse weight of the semiconductor device is adjusted through the program operation.

In an embodiment, an electric field from the top gate 310 to the bottom gate 330 is formed. The electric field is formed by applying a higher voltage to the bottom gate 330 and a lower voltage to the top gate 310. For example, the electric field is formed by controlling the voltage of the top gate 310 as 0V and the voltage of the bottom gate 330 as a positive value. A potential difference between the bottom gate 330 and the top gate 310 for forming the electric field depends on the material properties of the body 100, the thickness of the body 100, the material properties of the insulating layer 410, 420 or 440 and the thickness of the insulating layer 410, 420 or 440.

The potential difference for forming the electric field may be referred to as a program potential difference. Accordingly, when the voltage of the top gate 310 is 0V, the voltage of the bottom gate 330 is referred to as a program voltage.

As described above, when the program voltage is applied to the bottom gate 330, a channel is formed between the double gates 310, 330, and electric charge is stored in the charge storage layer 430. Here, the program voltage is any voltage of predetermined range. A minimum voltage value of the program voltage may be a lowest one of a voltage that makes to the stored electric charge from leaking out of the charge storage layer 430 in the semiconductor device having the insulating layer 410, 420, or 440 when the electric field disappears and another voltage for tunneling electric charge of the top gate 310 into the insulating layers 410, 420 between the top gate 310 and for tunneling the charge storage layer 430. A maximum voltage value of the program voltage may be a voltage for not damaging each insulating layer 410, 420, 440 when the corresponding voltage is applied.

Hence, the semiconductor device is designed to enable FN tunneling inside.

The insulating layers 410, 420 are so thin that the electric charge of the top gate 310 can tunnel into the bottom gate 330 when voltage within the allowable voltage range of the body 100 (for example, made of a polycrystalline or amorphous semiconductor material) is applied. When the insulating layer 410 of the top gate 310 and/or the insulating layer 420 of the stack 400 are too thick, a tunneling current from the top gate 310 reduces, thereby failing to adjust the weight.

The existing NOR flash memory in which voltage of 10V or 12V is applied as the gate voltage uses a tunneling insulating layer having the thickness of 7 nm, 10 nm and so on. However, when the tunneling insulating layers 410, 420 of FIG. 3 is designed to have the thickness of 7 nm, 10 nm, FN tunneling does not occur.

Accordingly, the insulating layer 410 is thinner than the gate insulating layer (for example, 7 nm to 10 nm) of the common transistor.

On the other hand, the insulating layers 420, 440 are thick enough to store the electric charge of the charge storage layer 430 when there is no electric field. When the insulating layers 420, 440 are too thin (for example, less than 3 nm), there is a high likelihood that a leak current may occur due to leakage of the electric charge in the charge storage layer 430 when performing the read operation through the top gate 310.

Additionally, the insulating layer 440 is thicker than the insulating layers 410, 420 to inhibit tunneling from the charge storage layer 430 to the bottom gate 330 under the electric field generated in the insulating layers 410, 420. For example, the insulating layer 440 is designed with a thickness for inhibiting FN tunneling into the bottom gate 330 under the allowable maximum voltage of the body 100.

Figure 5:
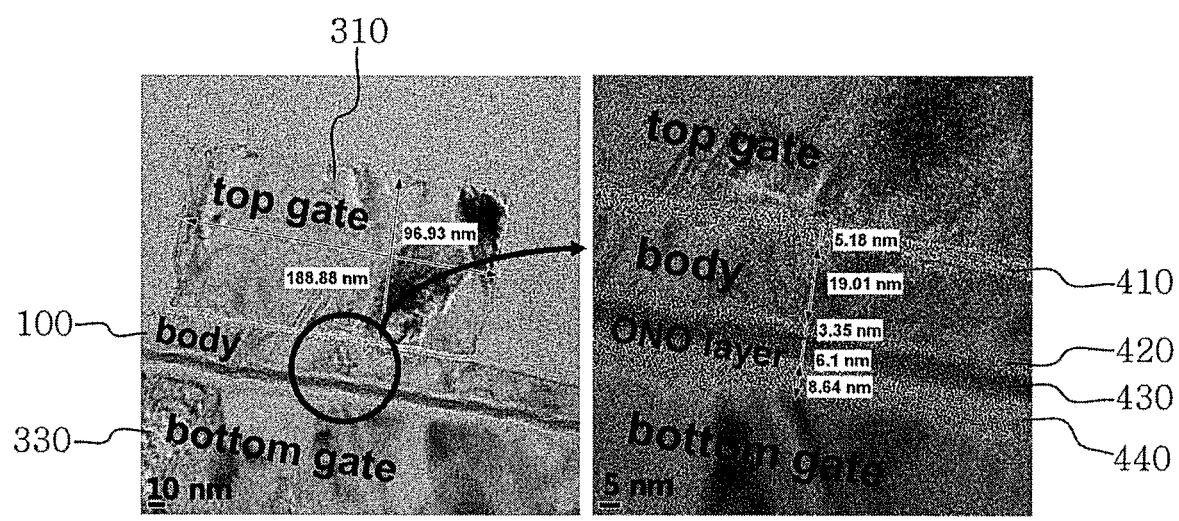
FIG. 5 is a transmission electron microscopy (TEM) image showing a cross section of a semiconductor device according to an embodiment of the present disclosure.

FIG. 5 is a transmission electron microscopy (TEM) image showing the cross section of the semiconductor device according to an embodiment of the present disclosure.

In an embodiment, the insulating layer 410 or 420 may have the thickness of less than 7 nm for movement of electric charge through FN tunneling. Additionally, the insulating layer 410 or 420 has the thickness of 3 nm or more to prevent leakage of electric charge when the electric field disappears. Meanwhile, the insulating layer 440 is thicker than the insulating layers 410 and 420 to prevent the movement of electric charge at the voltage at which tunneling occurs in the insulating layers 410 and 420.

In some embodiments, the gate insulating layer 410 is designed to have the thickness of 5 nm to 6 nm. Additionally, the insulating layer 420 of the stack 400 is designed to have the thickness of 3 nm to 4 nm. Additionally, the insulating layer 440 between the charge storage layer 430 and the bottom gate 330 is designed to have the thickness of 8 nm to 9 nm.

For example, as shown in FIG. 5, the insulating layers 410, 420 are 5.18 nm and 3.35 nm in thickness, respectively, and the insulating layer 440 is 8.64 nm in thickness.

When the program voltage (for example, 10V to 15V) is applied to the bottom gate 330 of the semiconductor device having the insulating layers 410, 420 that have the above-described thickness, a channel is formed between the gates 310, 330 and electric chargers of the top gate 310 pass the insulating layer 410 and electric chargers moves to the charge storage layer 430 through tunneling into the insulating layer 420. The insulating layer 440 inhibits the tunneling electric chargers into the bottom gate 330.

On the other hand, when the body 100 is too thick, the electric charge of the top gate 310 may not move to the charge storage layer 430 even though a predetermined range of voltage is applied. Accordingly, the body 100 is thick enough to allow the electric charge of the top gate 310 to move to the charge storage layer 430 through the insulating layers 410, 420 under the allowable electric field. For example, when the body 100 is made of polysilicon, the body 100 may be 20 nm or less in thickness.

As described below with reference to FIG. 8, the semiconductor device according to the embodiments of the present disclosure may form a similar synapse array to the array structure of a NOR flash memory and store electric charge in the charge storage layer 430 through the FN tunneling process.

Erase Operation

In the similar way to the program operation, the erase operation of the semiconductor device is also performed by FN tunneling. However, an electric field from the bottom gate 330 to the top gate 310 is formed to cause FN tunneling for the erase operation. That is, a potential difference is set in the opposite direction to the program operation.

In the above example, the erase operation may be performed by releasing stored electrons from the charge storage layer 430 through FN tunneling or storing holes in the charge storage layer 430 through FN tunneling, by applying a lower voltage than the voltage of the top gate 310 (for example, a negative voltage having the same absolute value as the positive voltage for the program operation) to the bottom gate 330.

The structure of the semiconductor device is not limited to FIG. 2. For example, the nitride layer stack 400 may be disposed in the top gate 310 direction. In this case, the semiconductor device performs the read operation through the bottom gate 330.

The semiconductor device of FIG. 2 may be used as a single device that performs programming and/or erasing through FN tunneling. However, it is not limited thereto and may be expanded to a flash memory array.

In an embodiment, the flash memory array may be used to form the neural network as the synapse array.

Synapse Block and Neural Network

The synapse block 10 including the above-described semiconductor device is configured to independently perform the program and/or erase operation for each cell, and thus it is possible to independently set a synapse weight for each cell. Additionally, the weighted sum calculation may be performed simply by reading the source current of the synapse block.

Figure 6:
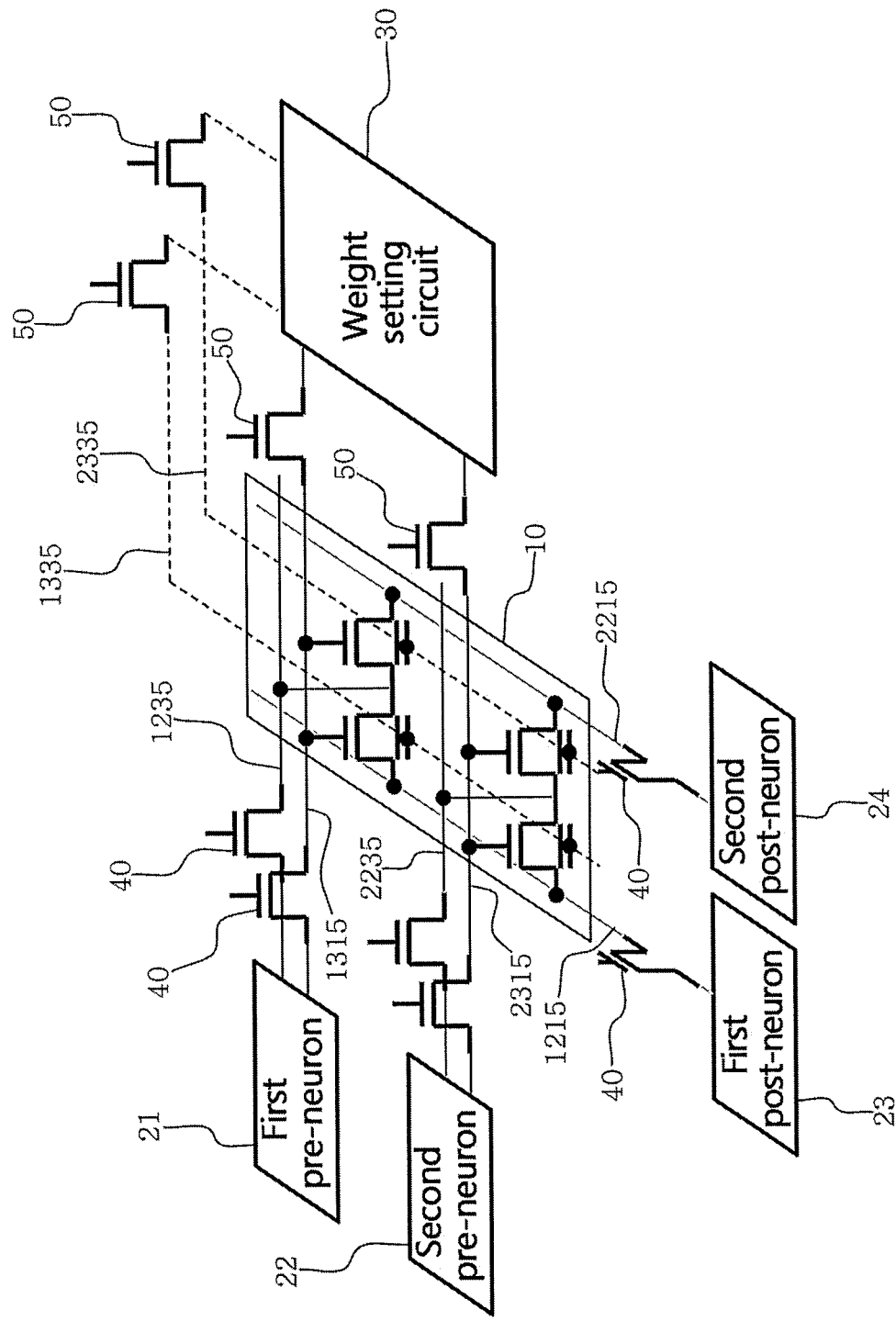
FIG. 6 is a circuit diagram showing a neural network including a synapse block according to an embodiment of the present disclosure.

FIG. 6 is a circuit diagram showing the neural network including the synapse block according to an embodiment of the present disclosure.

Referring to FIG. 6, the neural network 1 includes the synapse block 10 between neurons. According to the signal direction of the inference operation, a neuron transmitting a signal to the synapse block 10 is referred to as a pre-neuron of synapse, and a neuron receiving a signal from the synapse block 10 is referred to as a post-neuron of synapse.

The neurons and the synapse block 10 are connected with each other by the synapse array. As shown in FIG. 6, when two synapse arrays of the synapse block 10 is included, pre-neurons 21, 22 and post-neurons 23, 24 are each connected to the synapse block 10.

The neural network 1 includes a first switching device 40 to switch on/off the electrical connection between the synapse block 10 and the neurons 21, 22, 23, 24.

The synapse weight of the synapse block 10 is set by a separate control circuit (for example, a peripheral circuit, etc.) 30. The control circuit 30 may be connected to the target synapse block 10 intended to set the weight in the neural network 1 to adjust and set the weight of a particular synapse cell of the synapse block 10. The control circuit 30 may control the synapse block 10 through a plurality of control lines.

Additionally, the control circuit 30 and the synapse block 10 are further connected through a second switching device 50 which switches on/off the electrical connection. The adjustment of the synapse weight will be described in more detail below with reference to FIG. 8.

The switching operation of the first and second switching devices 40, 50 may be controlled by the control circuit 30 or a separate controller (for example, a computer, etc.).

Additionally, the first and second switching devices 40, 50 may be a transistor as shown in FIG. 6, etc., but are not limited thereto.

Figure 7:
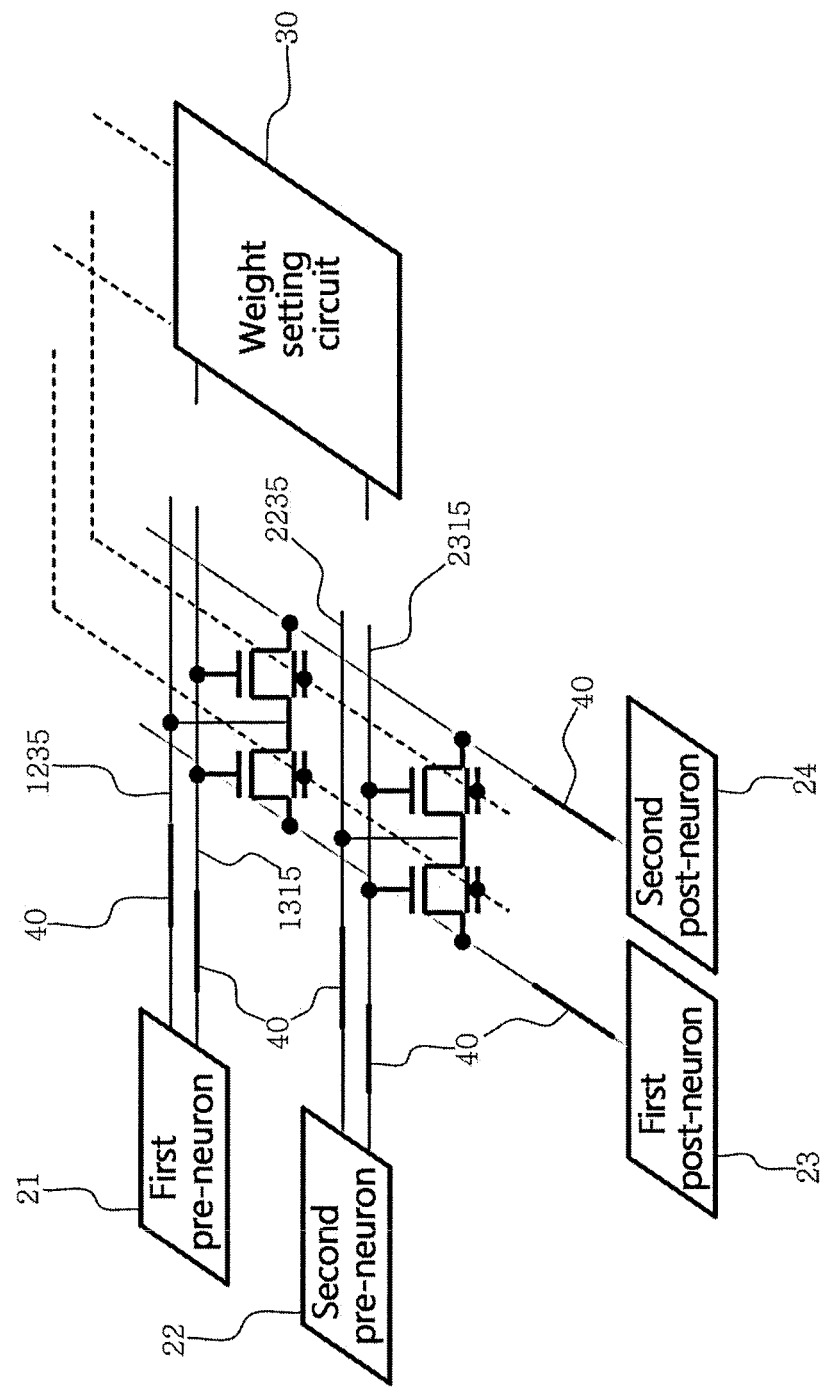
FIG. 7 is a diagram showing a connection configuration of the neural network of FIG. 6 in an inference mode.

FIG. 7 is a diagram showing the connection configuration of the neural network of FIG. 6 in the inference mode.

When the neural network 1 performs the inference operation, the pre-neurons 21, 22, the synapse block 10 and the post-neurons 23, 24 are electrically connected by the first switching device 40. As shown in FIG. 7, the synapse array is connected to each of the pre/post-neurons 21, 22, 23, 24.

On the contrary, the connection between the synapse block 10 and the control circuit 30 may be interrupted by the second switching device 50.

The synapse block 10 receives input signals from the pre-neurons 21, 22 and transmits calculation signals based on the input signals and the weight of the synapse block 10 to the post-neurons 23, 24.

Read Operation

Referring back to FIGS. 2 to 4, the operation of the synapse block 10 in the inference mode will be described in more detail.

The synapse block 10 of FIGS. 3 and 4 performs the read operation through the top gate 310. The synapse block 10 receives the input signals from the pre-neurons 21, 22 through the top gate 310 and/or the drain 230 (or the drain region 231).

In an embodiment, the neural network 1 includes a top gate line 315 connected to the top gate 310. As the top gate line 315 is a line which receives the input signals from the pre-neurons, the top gate line 315 may be referred to as a pre-synaptic input line (PIL). When the synapse block 10 includes the first synapse array and the second synapse array, the neural network 1 includes two top gate lines 1315, 2315.

Additionally, the neural network 1 includes a drain line (DL) 235 connected to the drain 230 (or the drain region 231). The drain line 235 also receives the input signals from the pre-neurons 21, 22. When the synapse block 10 includes the first synapse array and the second synapse array, the neural network 1 includes two drain lines 1235, 2235.

In an embodiment, the drain line 235 is positioned in parallel to the top gate line 315.

In some embodiments, a drain plug 233 is connected to share drains (for example, 230A, 230B) of two cells to increase the area efficiency of the array. For example, as shown in FIG. 3, the drain plug 233 is connected to the drain region 231 including the drains 230A, 230B of the two cells A, B, and is configured to come into contact with both the drains 230A, 230B of the two cells A, B.

When the synapse block 10 receives the input signals from the pre-neurons 21, 22 through the top gate line 315 and the drain line 235, the synapse block 10 generates output signals of the cells representing the multiplication of the input signals by a preset synapse weight for each cell, and transmits each of the generated output signals of the cells to the post-neurons 23, 24.

The neural network 1 includes a source line 215 connected to the source region 211. The source line 215 transmits the source current representing the multiplication of the input signal by the synapse weight to the post-neurons 23, 24.

In an embodiment, the source line 215 is positioned perpendicular to the top gate line 315. The source line 215 transmits, to the post-neurons, the parallel sum of output currents of the synapse array disposed in a direction perpendicular to the direction of the top gate line 315. The output current of the synapse array represents the sum of respective source currents (i.e., the calculation signal) of the synapse cells included in the corresponding array.

As a result, the neural network 1 may automatically perform weighted sum calculation of the synapse block 10 through the source line 215.

As the source current is the output signal of the synapse block 10 transmitted to the post-neurons 23, 24, the source line 215 may be referred to as a post-synaptic output line (POL). When the synapse block 10 includes the first synapse array and the second synapse array, the neural network 1 includes two source lines 1215, 2215.

Weight Setting for Each Synapse Cell

As described above, the semiconductor device within the synapse block 10 performs the program/erase operation through the potential difference between the double gates (for example, through the voltage control of the bottom gate 330 when the top gate 310 is 0V).

For the program/erase operation, in addition to some control lines 1235, 2235, 1315, 2315 of the control lines for the read operation as described above, an additional control line is required.

Referring to FIGS. 2 and 6, the neural network 1 includes a bottom gate line (BGL) 335 connected to the bottom gate 330 of the first and second synapse arrays. When the neural network 1 includes the first synapse array and the second synapse array shown in the FIG. 2, the synapse block 10 includes two bottom gate lines 1335, 2335.

Each cell within the synapse array is connected in parallel to the source line 215, and the drain line 235 and the source line 215 are perpendicular to each other, similar to the array structure of a NOR flash memory.

By a method for setting the weight of the synapse block according to another aspect of the present disclosure, it is possible to adjust the synapse weight of a particular target cell of the synapse block 10 having a similar array structure to a NOR flash memory through the FN tunneling process. Further, it is possible to independently set the synapse weight for each cell of the synapse block 10 through the FN tunneling process.

Figure 8:
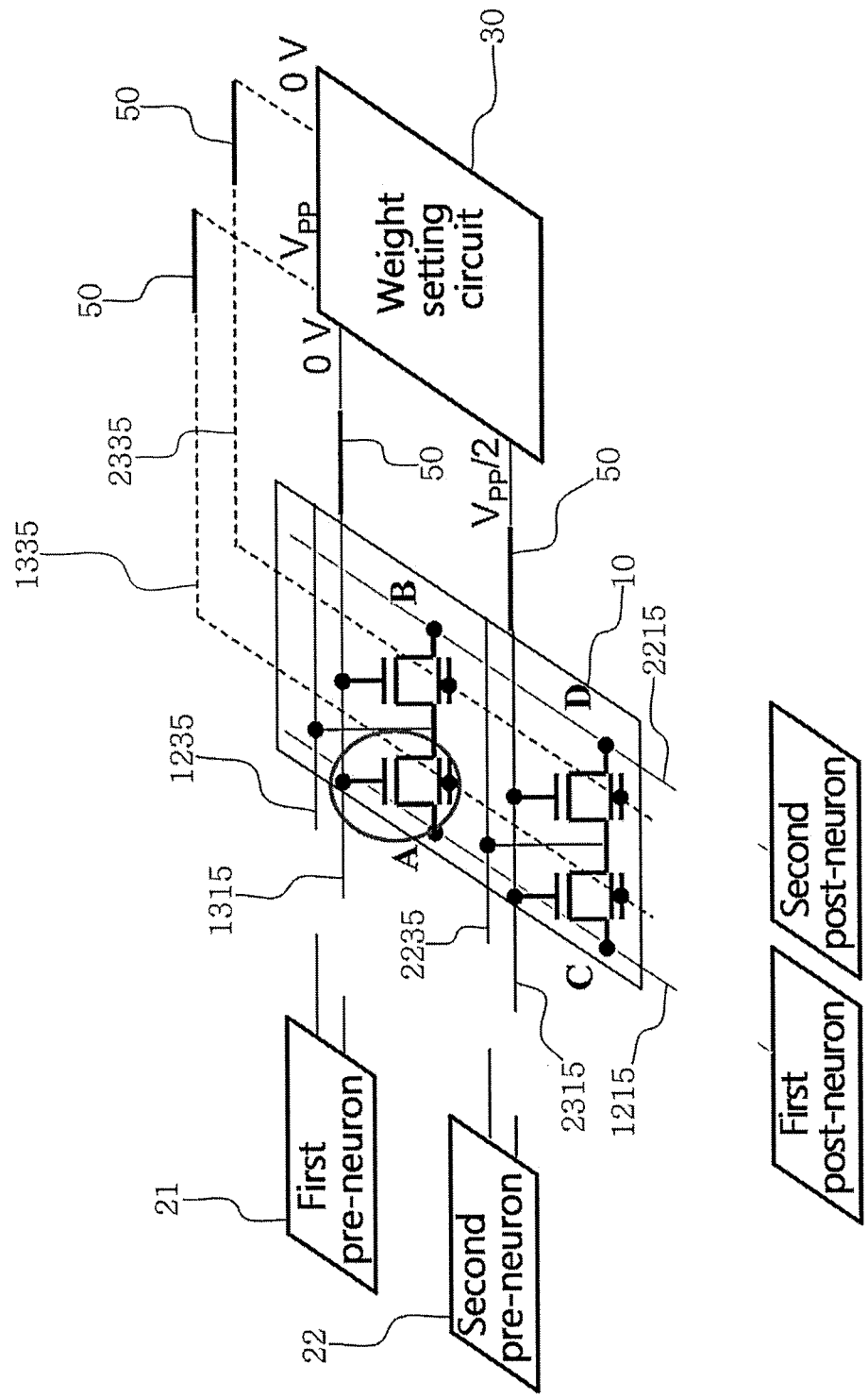
FIG. 8 is a diagram for describing a process of adjusting a synapse weight of a target cell in a synapse block of FIG. 5.

FIG. 8 is a diagram for describing a process of adjusting the synapse weight of the target cell in the synapse block of FIG. 5.

Referring to FIG. 8, in the weight adjustment mode, as opposed to the inference mode, the synapse block 10 is disconnected from the neurons and connected to the control circuit 30 for weight adjustment through FN tunneling.

For clarity of description, the weight adjusting process is described under the assumption of an example of adjusting the synapse weight of the semiconductor device A in the synapse block 10 including the semiconductor devices A, B, C, D.

The semiconductor device A is a target cell for weight adjustment, and to perform the program operation of the semiconductor device A through FN tunneling, the source 210A and the drain 230A of the target semiconductor device A are allowed to float. In an embodiment, the source 210A and the drain 230A are allowed to float by the switching-off of the first switching device 40.

To form a channel from the top gate 310A of the semiconductor device A to the bottom gate 330A of the semiconductor device A, a potential difference between the top gate 310A and the bottom gate 330A is controlled. For example, a channel is formed by applying different voltages to the top gate 310A and the bottom gate 330A of the target semiconductor device A to control a potential difference between the top gate 310A and the bottom gate 330A.

When an electric field from the top gate 310A to the bottom gate 330A is formed, electric charge of the top gate 310A moves to the bottom gate 330A. In an example, the control circuit 30 controls the voltage of the top gate 310A to 0V through the top gate line 1315 connected to the semiconductor device A, and applies the program voltage ($V_{PP}$) through the bottom gate line 1335 connected to the semiconductor device A to move electric charge of the bottom gate 310B to the charge storage layer 430A through FN tunneling. The program voltage ($V_{PP}$) may be, for example, 12V as described above, but is not limited thereto.

Accordingly, a channel of electric current from the top gate 310A to the bottom gate 330A is formed, and electric charge tunneled in the top gate 310A moves to the bottom gate 330A through tunneling. Finally, the tunneled electric charge is trapped in the charge storage layer 430 by the nitride layer 440, thereby adjusting the weight of the target cell A.

Additionally, the remaining synapse cells B, C, D other than the target cell are controlled to program inhibit.

The semiconductor device B is a synapse cell that shares the top gate line 1315 with the target semiconductor device A, and the same voltage as the top gate 310A is applied to the top gate 310B to adjust the weight of the semiconductor device A. In the above example, 0V is applied to the top gate 310B.

To prevent the FN tunneling in the semiconductor device B, the potential of the bottom gate 330B of the semiconductor device B is controlled to the same potential as the top gate 310B of the semiconductor device B. In the above example, the control circuit controls the voltage of the bottom gate 330B to 0V through the bottom gate line 2335.

Then, an electric field from the top gate 310B to the bottom gate 330B is not formed in the semiconductor device B, thereby inhibiting the weight adjustment.

The semiconductor device C is a synapse cell that shares the bottom gate line 1335 with the target semiconductor device A. The bottom gate 330C of the semiconductor device C is already applied with the program voltage of the bottom gate 330A of the semiconductor device A for adjusting the weight of the semiconductor device A. In the above example, 12V is already applied to the bottom gate 330C.

The FN tunneling of the semiconductor device C is prevented by boosting the channel of the semiconductor device C under the influence of the program potential difference (or the program voltage ($V_{PP}$)) of the semiconductor device A. In the above example, the control circuit 30 applies a program inhibit voltage to the top gate 310C through the top gate line 2315 to prevent the movement of electric charge.

The program inhibit voltage applied to the top gate 310C may be, for example, approximately half of the program voltage ($V_{PP}$), such as 0.4 $V_{PP}$ to 0.6 $V_{PP}$ but is not limited thereto.

Accordingly, the potential difference between the bottom gate 330C and the top gate 310C reduces, thereby preventing electric charge of the top gate 310C from moving to the charge storage layer 430C, and as a consequence, inhibiting the weight setting in the semiconductor device C.

The semiconductor device D is a synapse cell that shares the top gate line 2315 with the semiconductor device C and the bottom gate line 2335 with the semiconductor device B. Accordingly, the top gate 310D of the semiconductor device D already has the same voltage as the program inhibit voltage of the top gate 310C, and the bottom gate 330D has the same voltage as the voltage of the bottom gate 330D of the semiconductor device D.

In some embodiments, the semiconductor device D may have a potential difference between the gates 310D, 330D avoiding FN tunneling. In this case, the semiconductor device D is automatically inhibited from programming by the voltage control of the previous semiconductor devices A, B, C.

In some other embodiments, the semiconductor device D may have a potential difference between the gates 310D, 330D leading to FN tunneling. However, in this case, FN tunneling occurs from the bottom gate 330D to the top gate 310D, and as the top gate 310D does not have the charge storage layer 430, weight setting does not occur. Since in general, flash memory performs the erase operation before the program operation, electric charge stored in the charge storage layer 430 does not move to the top gate 310D by the above-described potential difference.

Subsequently, the synapse weight may be independently adjusted for the remaining semiconductor devices B, C, D within the synapse block 10 via a process that includes the step of applying the program voltage ($V_{PP}$) to the bottom gate 330 of the new target semiconductor device B, C, or D and the step of applying the program inhibit voltage (for example, 0.5$V_{PP}$) to the top gate 310 of the other semiconductor device B, C, or D sharing the bottom gate line 335 of the new target semiconductor B, C, or D.

The erase process of erasing the synapse weight already set to the synapse block 10 of FIG. 8 is similar to the above-described synapse weight setting process. However, the erase process may be performed by applying an electric field of the opposite direction to the electric field for setting the synapse weight to the target synapse cell as described above in the program/erase operation of the semiconductor device. For example, the synapse weight may be erased by forming an electric field of the opposite direction by a voltage having the same absolute value as the program voltage for weight setting but the opposite symbol.

Figure 9:
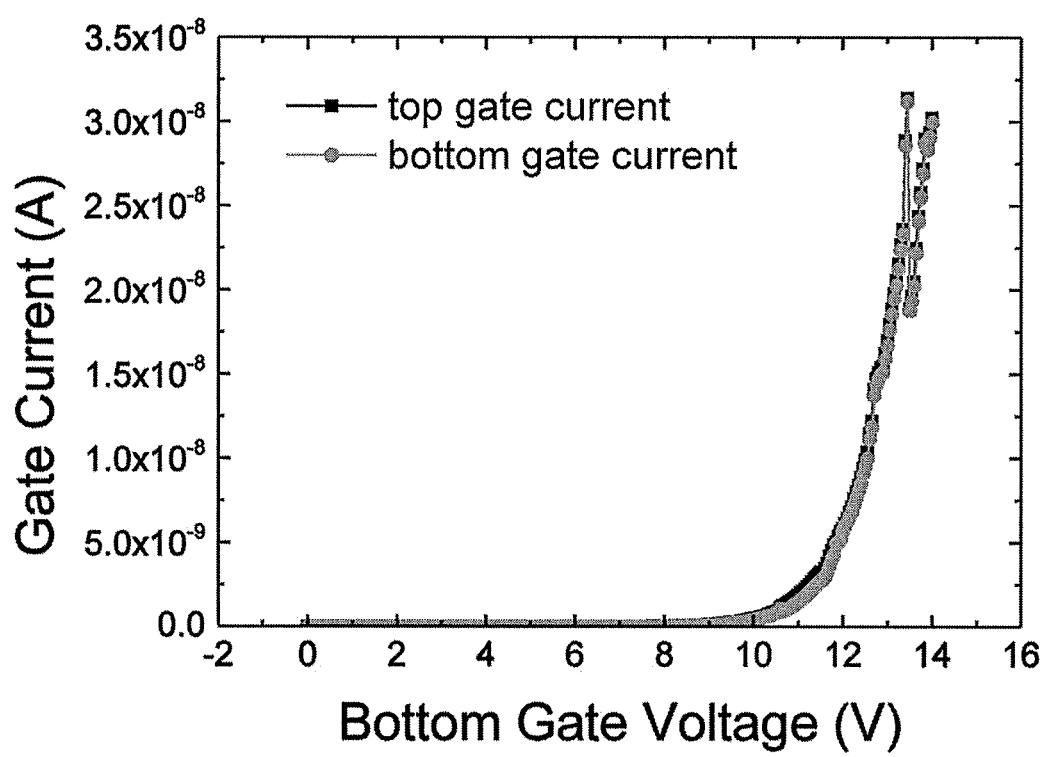
FIG. 9 is a diagram showing the characteristics of the target semiconductor device of FIG. 8 in a synapse weight setting process.

FIG. 9 is a diagram showing the characteristics of the target semiconductor device of FIG. 8 in the synapse weight setting process.

In the graph of FIG. 9, x axis indicates the voltage of the bottom gate 310A, and y axis indicates the intensity of electric current of the gate terminal 310A, 330A. The intensity of electric current is the absolute value.

Experimentally, after allowing the source 210A and the drain 230A of the semiconductor device A in the synapse block 10 to float, 0V is applied to the top gate 310A, and the electric current of the top gate 310A and the bottom gate 330A is measured with varying voltage of the bottom gate 330A from 0V to 14V. As a result, it is found that gate currents having the same magnitude and the opposite symbols flow in the two terminals 310A, 330A.

That is, the graph of FIG. 9 shows that the tunneling current formed toward the bottom gate 330A is based on tunneling from the top gate 310A.

Additionally, the magnitude of the tunneling current of the semiconductor device A is on 10 nA level. The magnitude of the tunneling current is a very small value, compared to the weight setting current of the existing NOR flash memory. Accordingly, the graph of FIG. 9 supports that when the semiconductor device and the synapse block according to the embodiments of the present disclosure performs the program operation through FN tunneling, it is possible to reduce power consumption to at least one thousandth of the CHI process used in the existing NOR flash memory.

Figure 10:
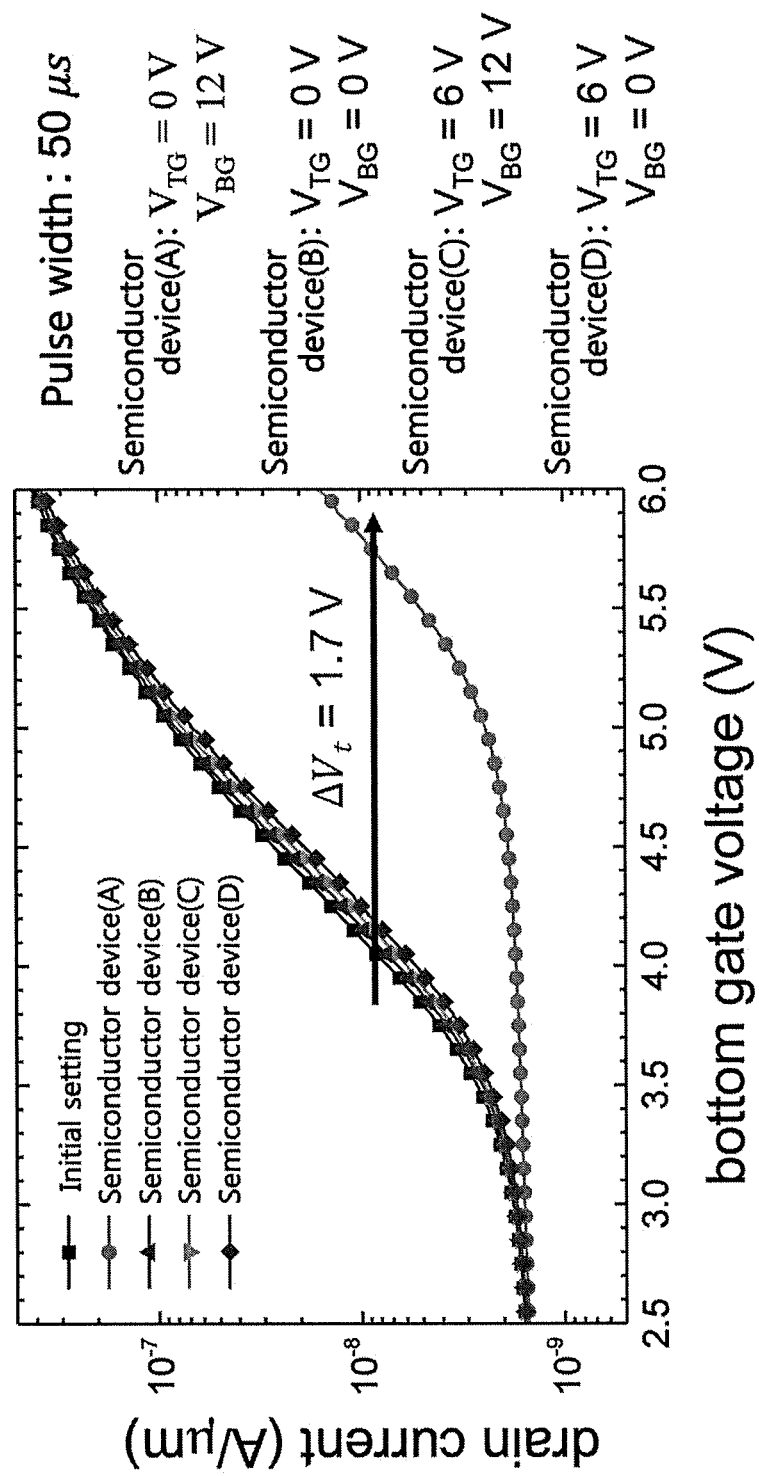
FIG. 10 is a diagram showing the result according to the synapse weight setting method of FIG. 8.

FIG. 10 is a diagram showing the result according to the synapse weight setting method of FIG. 8.

By the method for setting the synapse weight of the target semiconductor device described with reference to FIG. 8, the synapse weight of the target semiconductor device A may be determined. The synapse weight setting in the semiconductor device is represented as a shift of the threshold voltage of the semiconductor device.

As shown in FIG. 10, only the threshold voltage of the semiconductor device A intended to set the synapse weight is shifted to the right, and the threshold voltage of the remaining semiconductor devices B, C, D inhibited from programming is almost maintained without any substantial change.

While the present disclosure has been hereinabove described with reference to the embodiments shown in the drawings, this is provided for illustration purposes only and it will be appreciated by those skilled in the art that various modifications and variations may be made thereto. However, it should be noted that such modifications fall in the technical protection scope of the present disclosure. Therefore, the true technical protection scope of the present disclosure should be defined by the technical spirit of the appended claims.

INDUSTRIAL APPLICABILITY

With the Fourth Industrial Revolution, artificial intelligent related industry is globally growing very fast, and in particular, many studies are being made on electronic devices that emulate the functions of synapses and neurons of the biological nervous system.

The semiconductor device according to the embodiments of the present disclosure can provide a synapse array (and a synapse block) with compatibility with the existing semiconductor process and high reliability. Accordingly, it is expected to provide high competitiveness in the field of neural network technology in hardware aspect.

The invention claimed is:

1. A semiconductor device, comprising:
a body made of a first conducting semiconductor material;
a source and a drain that are made of a second conducting semiconductor material formed on the body;
a gate insulating layer formed on the body;
a first gate formed on the gate insulating layer;
a second gate formed opposite the first gate, wherein the body is positioned between the first gate and the second gate; and
an insulating layer stack having a charge storage layer formed between the body and the second gate;
wherein electrons or holes of the first gate tunnel into the second gate on a state where the source and the drain are floated if an electric field from the first gate to the second gate is formed by a potential difference between the first gate and the second gate.

2. The semiconductor device according to claim 1, wherein the insulating layer stack further comprises:
a first stack insulating layer formed on the charge storage layer; and
a second stack insulating layer formed opposite the first stack insulating layer,
wherein the charge storage layer is positioned between the first stack insulating layer and the second stack insulating layer.

3. The semiconductor device according to claim 2, wherein the first stack insulating layer is configured to allow electric charges of the first gate to tunnel to the second gate if the electric field is formed by a potential difference between the first gate and the second gate, wherein the potential difference between the first gate and the second gate causes to maintain each insulating layer without damaging each insulating layer.

4. The semiconductor device according to claim 3, wherein the first stack insulating layer has a thickness of less than 7 nm.

5. The semiconductor device according to claim 3, wherein the first stack insulating layer is further configured to prevent the electric charge tunneled in the charge storage layer from leaking when the electric field disappears.

6. The semiconductor device according to claim 5, wherein the first stack insulating layer has a thickness of 3 nm or more.

7. The semiconductor device according to claim 2, wherein the second stack insulating layer is configured to inhibit tunneling of electric charges of the first gate to the second gate if an electric field is formed by a potential difference between the first gate and the second gate, wherein the potential difference between the first gate and the second gate causes to maintain each insulating layer without damaging each insulating layer.

8. The semiconductor device according to claim 7, wherein the second stack insulating layer has a thickness of 8 nm or more.

9. The semiconductor device according to claim 1, wherein the body is made of any one of a polycrystalline semiconductor material, an amorphous semiconductor material and a combination thereof.

10. A neural network having a plurality of semiconductor devices of claim 1 as synapse cells, the neural network comprising:
   a synapse block including a first synapse array and a second synapse, wherein the first synapse array includes a first semiconductor device and a second semiconductor device and a second synapse array includes a third semiconductor device and a fourth semiconductor device, each synapse array configured such that drains of different semiconductor devices are arranged adjacent to each other;
   drain lines electrically connected to a drain region of each synapse array;
   first gate lines electrically connected to a first gate of each synapse array; and
   source lines electrically connected to a source region of the first synapse array and a source region of the second synapse array,
   wherein the drain line and the first gate line receive an input signal from a pre-neuron, and the source line outputs a calculation result at the synapse block as an output signal to a post-neuron.

11. The neural network according to claim 10, wherein the synapse block is configured to: form a source signal based on the input signal and a preset weight for each semiconductor device when receiving the input signal.

12. The neural network according to claim 11, wherein the output signal is a sum of the source signals of each semiconductor device.

13. The neural network according to claim 10, wherein the synapse block connects the pre-neuron and the post-neuron through first switching devices which switch on/off electrical connections of the pre-neuron, the post-neuron and the synapse block, and
   the synapse block is further connected to a control circuit through a second gate line electrically connected to a second gate of the first synapse array and a second gate of the second synapse array; and a second switching device which switches on/off an electrical connection between the control circuit and the synapse block, wherein the control circuit controls the semiconductor device through at least some of the plurality of lines.

14. The neural network according to claim 10, wherein the output of the calculation result is performed in an ON state of the first switching device and an OFF state of the second switching device, and
   the operation of the control circuit is performed in an OFF state of the first switching device and an ON state of the second switching device.

* * * * *